(12) United States Patent
Nishinohara et al.

(10) Patent No.: US 10,135,014 B2
(45) Date of Patent: Nov. 20, 2018

(54) DISPLAY DEVICE AND METHOD OF MANUFACTURING DISPLAY DEVICE

(71) Applicant: Japan Display Inc., Tokyo (JP)

(72) Inventors: Takuma Nishinohara, Tokyo (JP); Yasukazu Kimura, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/686,872

(22) Filed: Aug. 25, 2017

(65) Prior Publication Data

US 2018/0090700 A1    Mar. 29, 2018

(30) Foreign Application Priority Data

Sep. 23, 2016  (JP) ................. 2016-185471

(51) Int. Cl.
*H01L 51/00* (2006.01)
*H01J 37/32* (2006.01)
*H01L 27/32* (2006.01)
*H01L 27/12* (2006.01)

(52) U.S. Cl.
CPC .... *H01L 51/0097* (2013.01); *H01J 37/32018* (2013.01); *H01L 27/3262* (2013.01); *H01L 27/3276* (2013.01); *H01J 2237/336* (2013.01); *H01L 27/1214* (2013.01); *H01L 2251/5338* (2013.01)

(58) Field of Classification Search
CPC ............. H01L 51/0097; H01L 27/3262; H01L 27/3276; H01L 27/1214
See application file for complete search history.

(56) References Cited

U.S. PATENT DOCUMENTS

| | | | |
|---|---|---|---|
| 2016/0027851 A1* | 1/2016 | Yanagisawa | ........ H01L 27/3244 257/43 |
| 2016/0336537 A1* | 11/2016 | Tsuruoka | ............ H01L 51/0097 |
| 2017/0059905 A1* | 3/2017 | Wang | ..................... G02F 1/1339 |
| 2017/0249886 A1* | 8/2017 | Choi | ....................... G09G 3/007 |
| 2018/0061893 A1* | 3/2018 | Breedlove | ............. H01L 27/322 |

FOREIGN PATENT DOCUMENTS

JP    2005-311171 A    11/2005

* cited by examiner

*Primary Examiner* — Anne Hines
(74) *Attorney, Agent, or Firm* — Typha IP LLC

(57) ABSTRACT

Disclosed is a display device, including a first substrate having flexibility including a pixel region and a frame region around the pixel region, a pixel arranged on a first surface of the first substrate in the pixel region, and a terminal section arranged in the frame region and connected to the pixel, in which the first substrate includes an adjustment region between the pixel and the terminal section, the adjustment region having a different Young's modulus from those of the pixel region and the frame region.

13 Claims, 10 Drawing Sheets

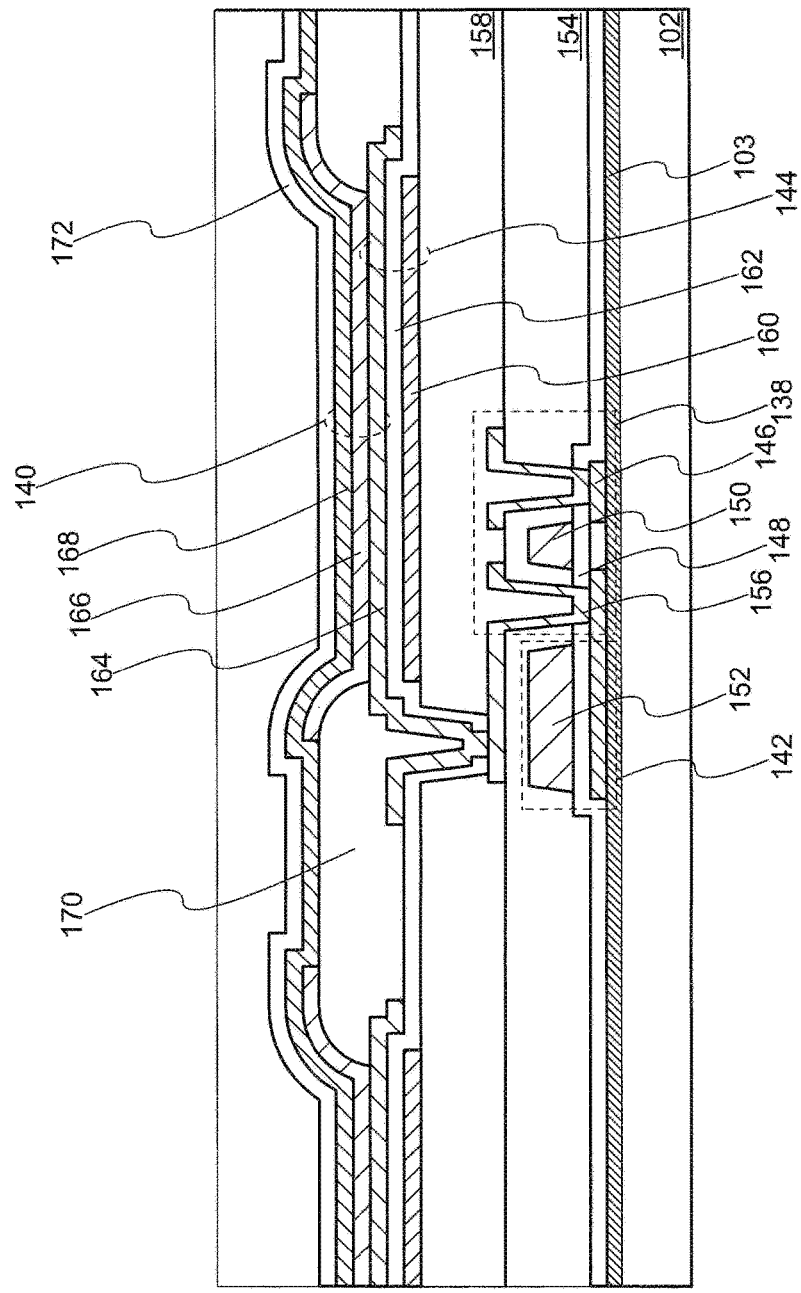

DISPLAY DEVICE AND METHOD OF MANUFACTURING DISPLAY DEVICE

CROSS-REFERENCE TO RELATED APPLICATIONS

This application is based upon and claims the benefit of priority from the prior Japanese Patent Application No. 2016-185471, filed on Sep. 23, 2016, the entire contents of which are incorporated herein by reference.

FIELD

The present invention relates to a display device. An embodiment of the present invention relates to a structure of a bending section in a display device using a flexible substrate.

BACKGROUND

In an organic electroluminescence (EL) display device, a flexible display in which an organic EL element is provided on a substrate having flexibility such as a plastic substrate has been developed. The flexible display can be curved and folded. Thus, a display superior in portability and storability has been expected to be implementable. However, when the flexible display is bent, a stress is exerted on each of elements such as a transistor, an organic EL element and the like provided on the flexible substrate, resulting in a reduced reliability.

To reduce an effect of such a bending stress, an organic semiconductor device in which a neutral plane on which neither a compressive stress nor a tensile stress is substantially exerted is arranged in the vicinity of a layer where an organic semiconductor element is formed is disclosed (see Japanese Patent Application Laid-Open No. 2005-311171).

However, even if the semiconductor element is arranged in the vicinity of the neutral plane, the compressive stress and the tensile stress are exerted on the front and back of a flexible substrate in a bending section. Therefore, a position of the bending section is difficult to accurately control. If the position of the bending section is not determined in a display panel, a product shape is not stabilized. Further, when a flexible coating layer is added as a constituent factor, manufacturing processes become more complicated.

SUMMARY

An embodiment of the present invention is a display device, including a first substrate having flexibility including a pixel region and a frame region around the pixel region, a pixel arranged on a first surface of the first substrate in the pixel region, and a terminal section arranged in the frame region and connected to the pixel, in which the first substrate includes an adjustment region between the pixel and the terminal section, the adjustment region having a different Young's modulus from those of the pixel region and the frame region.

BRIEF DESCRIPTION OF DRAWINGS

FIG. 4 is a cross-sectional view illustrating the configuration of the display device according to the present embodiment.

DESCRIPTION OF EMBODIMENTS

Figure 1:
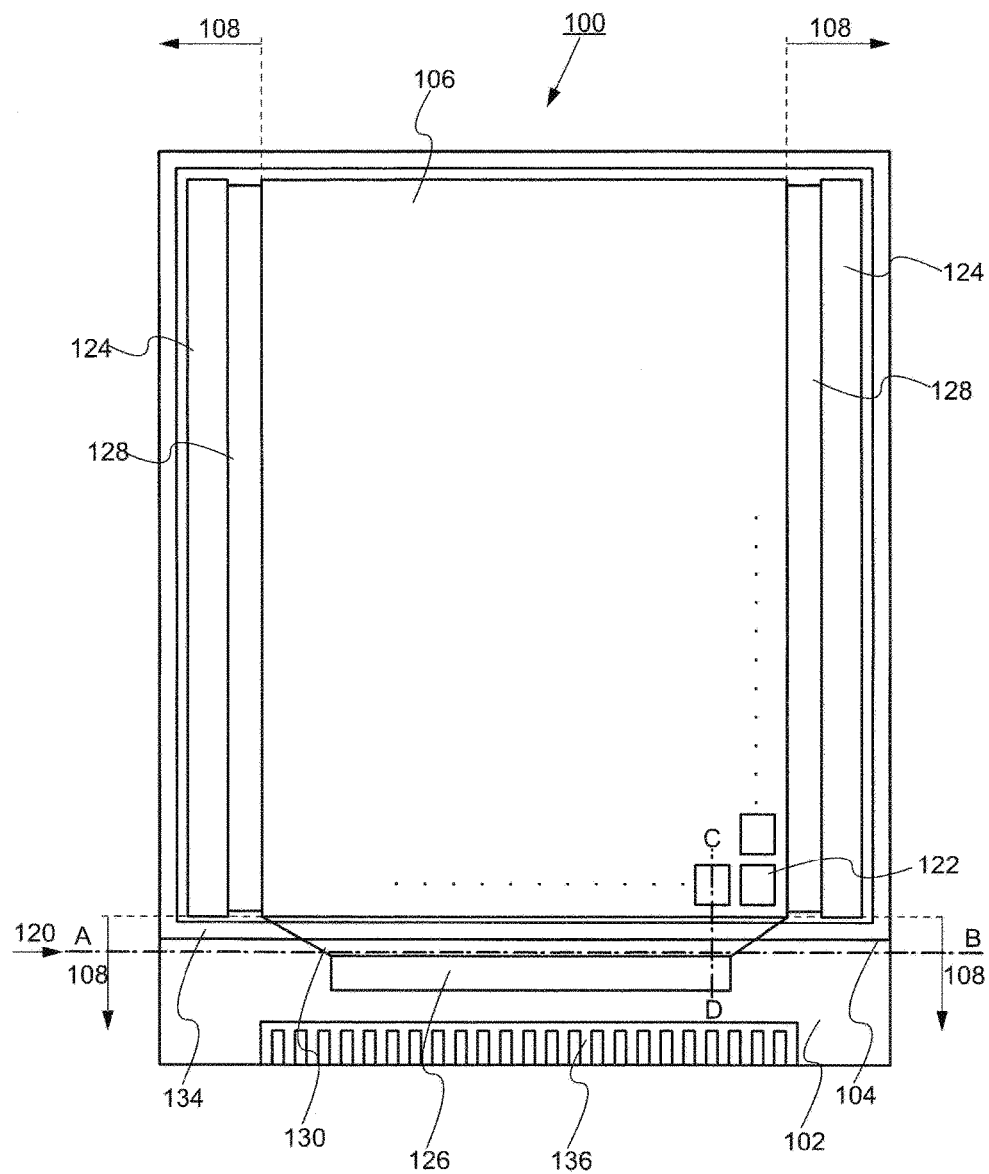
FIG. 1 is a plan view illustrating a configuration of a display device according to the present embodiment.

An embodiment of the present invention will hereinafter be described with reference to the drawings. However, the present invention can be practiced in many different modes, and is not to be interpreted as being limited to contents of description of the embodiment illustrated below. While the width, the thickness, the shape and the like of each section may be more schematically represented than those in an actual mode to make the description clearer in the drawings, this is only one example, and is not intended to limit the interpretation of the present invention. Detailed description may be omitted, as needed, by assigning similar elements to those described above with reference to the already described drawings the same reference signs in the present specification and the drawings.

In the present specification, when a member or region exists "on (or under)" another member or region, this includes not only a case where the member or region exists just above (or just below) the other member or region but also a case where the member or region exists above (or below) the other member or region, i.e., a case where another component is included between the member or region above (below) the other member or region and the other member or region except as otherwise limited.

<Planar Configuration of Display Device>

FIG. 1 is a plan view illustrating a configuration of a display device 100 according to the present embodiment, illustrating one mode in which a substrate has not been bent. The display device 100 is provided with a pixel region 106 where pixels 122 are arranged on a first substrate 102. A frame region 108 exists in a region outside the pixel region 106. The frame region 108 includes a first driving circuit 124, a second driving circuit 126, a first wiring extension region 128, a second wiring extension region 130, and a sealing material 134. A terminal section 136 is provided at one end of the first substrate 102. The terminal section 136 and the first driving circuit 124 are connected to each other by a circuit and a wiring (not illustrated). The terminal section 136 and the second driving circuit 126 are connected to each other by a circuit and a wiring (not illustrated).

Each of transistors, described below, within the pixel region 106, and the first driving circuit 124 are connected to each other by a wiring (not illustrated). Each of the transistors, described below, within the pixel region 106, and the second driving circuit 126 are connected to each other by a wiring (not illustrated). The pixel region 106 is provided with scanning signal lines and video signal lines in addition to the pixels 122. Each of the pixels 122 in the pixel region 106 is respectively connected to the first driving circuit 124 and the second driving circuit 126 via the wirings. For example, the first driving circuit 124 is a driving circuit which outputs a scanning signal to the pixel region 106 via the scanning signal line. The second driving circuit 126 is a driving circuit which outputs a video signal to the pixel region 106 via the video signal line. FIG. 1 illustrates a mode including the first wiring extension region 128 between the pixel region 106 and the first driving circuit 124 and the second wiring extension region 130 between the pixel region 106 and the second driving circuit 126.

Figure 2:
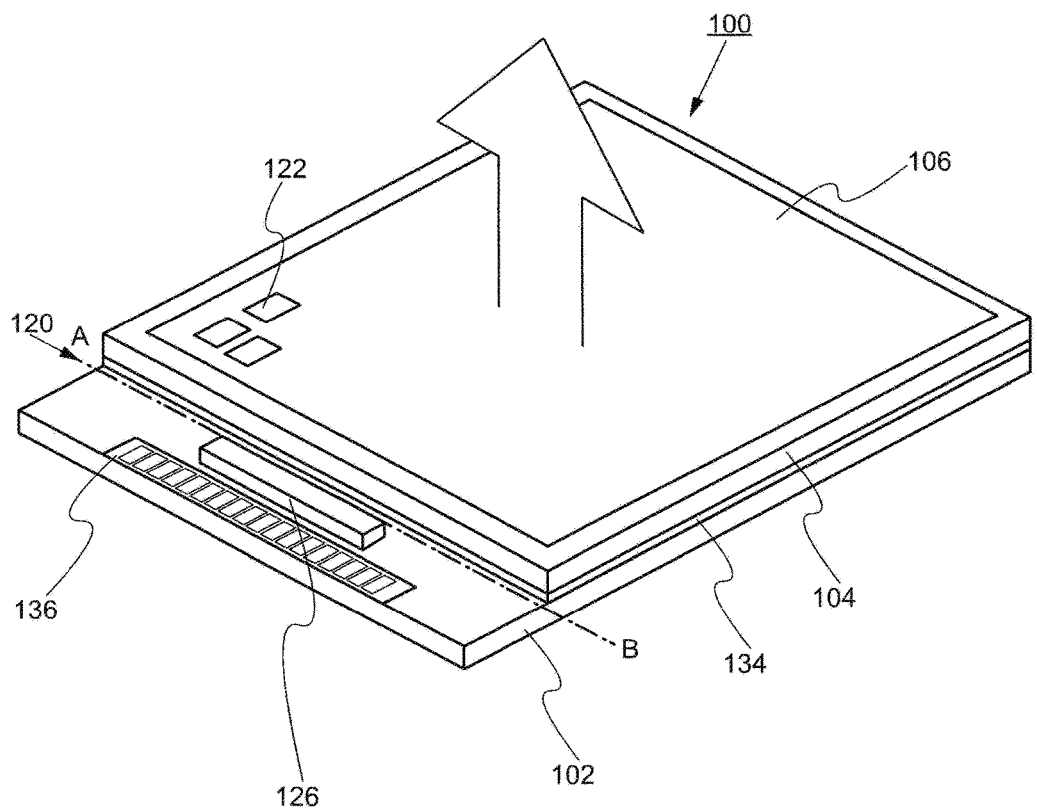
FIG. 2 is a perspective view illustrating the configuration of the display device according to the present embodiment.

FIG. 2 is a perspective view illustrating a configuration of the display device 100 according to the present embodiment, illustrating one mode in which a substrate has not been bent. The display device 100 is provided with a second substrate 104 opposing the first substrate 102. The second substrate 104 covers the pixel region 106, the first driving circuit 124, and the first wiring extension region 128. The second substrate 104 is provided with it being spaced apart from the first substrate 102. A sealing material 134 is provided along an outer peripheral portion of the second substrate 104. The first substrate 102 and the second substrate 104 adhere to each other using the sealing material 134.

A substrate member having flexibility is used as the first substrate 102. An example of the substrate member is an organic resin material. As the resin material, a high-polymer material having an imide bond in its repetitive unit, e.g., polyimide and the like is used. More specifically, a substrate having polyimide molded therein in a sheet shape can be used as the first substrate 102.

The first substrate 102 is formed using a varnish method for applying and sintering a resin material to a thin metal plate substrate or a thin glass plate substrate. Instead of the varnish method, a film-type composite substrate in which a resin film is stuck to the thin metal plate substrate or the thin glass plate substrate may be used. In addition, a roll-to-roll method can also be used.

In FIG. 1 and FIG. 2, a bending section 120 along which the display device 100 is folded is indicated by a line A-B. The bending section 120 is provided along one side of the pixel region 106. The bending section 120 is positioned between the pixel region 106 and the terminal section 136. While the bending section 120 is positioned in the second wiring extension region 130 between the pixel region 106 and the second driving circuit 126 in FIG. 1 and FIG. 2, the present invention is not limited to this. The bending section 120 may be a region on the first substrate 102 and outside the second substrate 104. The closer the bending section 120 to the pixel region 106, the narrower a frame of the display device 100 can be made.

As illustrated in FIG. 1, the bending section 120 is arranged in the second wiring extension region 130. Thus, even if the first substrate 102 is folded, the pixel region 106, the first driving circuit 124, and the second driving circuit 126 can be prevented from being affected by a stress. That is, a bending stress can be prevented from being directly exerted on elements such as transistors and the like included in the pixel region 106, the first driving circuit 124, and the second driving circuit 126. Thus, the reliability of the display device 100 can be prevented from being reduced by a bending stress.

Details of the display device 100 according to the present embodiment will be described below with reference to a cross-sectional schematic view along a line C-D illustrated in FIG. 1.

<Cross-Sectional Structure of Display Device>

Figure 3:
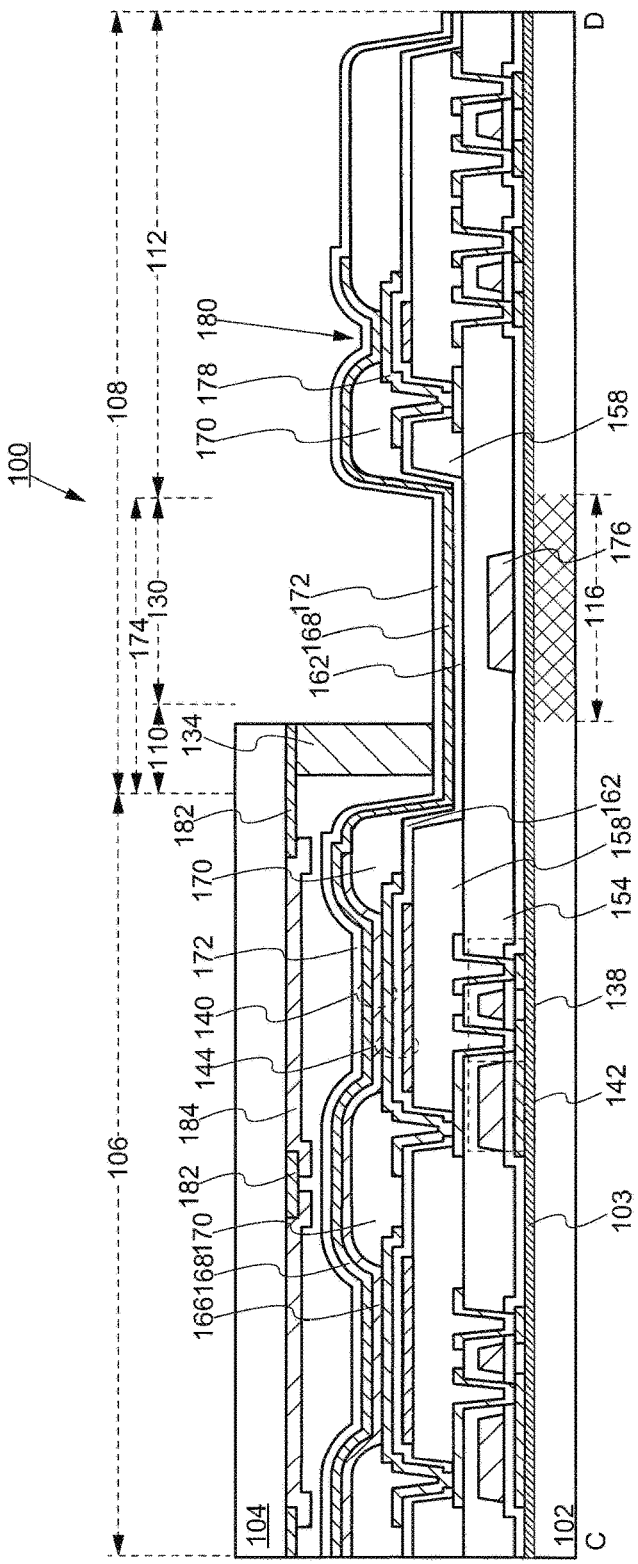
FIG. 3 is a cross-sectional view illustrating the configuration of the display device according to the present embodiment.

FIG. 3 is a cross-sectional view of the display device 100. FIG. 4 is a cross-sectional view illustrating details of the pixels 122 in the pixel region 106. The following description will be made with reference to FIG. 3 and FIG. 4, as needed. FIG. 3 illustrates a color filter-type display device in which an organic layer 166 is provided over the plurality of pixels 122. A light emitting element 140 which emits white light and a color filter layer 184 are provided in this case. FIG. 4 illustrates a separately painting-type display device in which the organic layer 166 having luminescent materials for respectively emitting lights in different colors is provided for each of the pixels 122.

As illustrated in FIG. 3, the display device 100 includes a driving circuit region 112, the second wiring extension region 130, the sealing region 110, and the pixel region 106 from a D end to a C end. The driving circuit region 112, the second wiring extension region 130, and the sealing region 110 among the regions correspond to the frame region 108.

In the pixel region 106, a transistor 138, the light emitting element 140, a first capacitive element 142, and a second capacitive element 144 are provided with a barrier layer 103 interposed therebetween on one surface (hereinafter referred to as a "first surface") of the first substrate 102. Details of the elements are illustrated in FIG. 4.

The barrier layer 103 is provided as an undercoat on the first substrate 102. The barrier layer 103 may have a three-layer stacked structure of a silicon oxide film, a silicon nitride film, and a silicon oxide film, for example. The silicon oxide film in a lowermost layer improves the adhesion to a base material. The silicon nitride film in a medium layer inhibits entrance of water and impurities from the outside. The silicon oxide film in an uppermost layer inhibits a hydrogen atom contained in the silicon nitride film in the medium layer from being diffused toward the element. However, the barrier layer 103 is not limited to this structure. The barrier layer 103 may have a more than three-layer stacked structure. Alternatively, the barrier layer 103 may have a single layer structure or a two-layer stacked structure.

As illustrated in FIG. 4, the light emitting element 140 is connected to the transistor 138. The transistor 138 controls light emission of the light emitting element 140. The first capacitive element 142 is provided to hold a gate potential of the transistor 138. The second capacitive element 144 is provided to adjust an amount of current flowing through the light emitting element 140.

The transistor 138 has a structure in which a semiconductor layer 146, a gate insulating layer 148, and a gate electrode 150 are stacked. The semiconductor layer 146 is formed of amorphous, polycrystalline silicon, an oxide semiconductor or the like. A source-drain electrode 156 is provided in a layer above the gate electrode 150 with a first insulating layer 154 interposed therebetween. A second insulating layer 158 serving as a flattening layer is provided in a layer above the source-drain electrode 156. The light emitting element 140 is provided on an upper surface of the second insulating layer 158. The second insulating layer 158 has a substantially flat surface by embedding a contact hole provided in the source-drain electrode 156 and the first insulating layer 154 and unevenness of the first insulating layer 154 caused by respective shapes of the gate electrode 150 and the semiconductor layer 146. The second insulating layer 158 may have a flat surface formed by performing etching processing or chemical mechanical polishing processing of a surface of an inorganic insulating layer. The second insulating layer 158 may have a flat surface leveled after applying or depositing a composition including a precursor such as acrylic, polyimide or the like.

The first capacitive element 142 is formed in a region where the semiconductor layer 146 and the first capacitance electrode 152 overlap each other with the gate insulating layer 148 used as a dielectric layer and a region where the source-drain electrode 156 and the first capacitance electrode 152 overlap each other with the first insulating layer 154 used as a dielectric layer.

The light emitting element 140 has a structure in which a pixel electrode 164, an organic layer 166, and an opposite electrode 168, which are electrically connected to the transistor 138, are stacked. The light emitting element 140 is a two-terminal element. The light emitting element 140 controls a potential between the pixel electrode 164 and the opposite electrode 168 so that light emission is controlled. A bank layer 170 is provided in the pixel region 106 to cover a peripheral edge and expose an inner region of the pixel electrode 164. The opposite electrode 168 is provided on an upper surface of the organic layer 166, and is provided from the top of the pixel electrode 164 to an upper surface portion of the bank layer 170. The bank layer 170 covers the peripheral edge of the pixel electrode 164. The bank layer 170 is formed of an organic resin material to form a smooth step at an end of the pixel electrode 164. Examples of the organic resin material include acrylic, polyimide or the like.

The organic layer 166 is a layer containing a luminescent material such as an organic EL material and the like. The organic layer 166 is formed using a low-molecular or high-molecular organic material. When the low-molecular organic material is used, the organic layer 166 includes a light emitting layer containing a luminescent organic material. Further, the organic layer 166 may include a hole injection layer and an electron injection layer and further a hole transport layer, an electron transport layer and the like so as to sandwich the light emitting layer therebetween. For example, the organic layer 166 can have a structure in which the light emitting layer is sandwiched between the hole injection layer and the electron injection layer. A hole transport layer, an electron transport layer, a hole block layer, and an electron block layer may have been added, as needed, in addition to the hole injection layer and the electron injection layer to the organic layer 166. The organic layer 166 may have luminescent materials respectively emitting lights in different colors provided therein for each of the pixels 122. For example, the light emitting element 140, which emits lights in red, green, and blue, is provided for each of the pixels 122 so that full-color display can be performed. The organic layer 166 may be provided with a layer containing a single luminescent material over the entire pixel. In this case, the light emitting element 140, which emits white light, and the color filter layer 184 are provided, as described below, so that full-color display can be performed.

In the present embodiment, a so-called top emission-type structure in which light emitted by the organic layer 166 is radiated toward the opposite electrode 168 is illustrated for the light emitting element 140. When the organic layer 166 has the hole injection layer, the light emitting layer, and the electron injection layer stacked therein in this order, the pixel electrode 164 can use indium tin oxide (tin oxide-added indium oxide) (ITO) and indium zinc oxide (indium oxide and zinc oxide) (IZO) superior in hole injection property. The ITO and the like is one type of translucent conductive material, and have a property of having high transmittance while having significantly low reflectance in a visible light band. To add a function of reflecting light on the pixel electrode 164, a metal layer such as an aluminum (Al) layer, a sliver (Ag) layer or the like is preferably stacked on the translucent conductive material. Alternatively, under the pixel electrode 164 formed of ITO, a second capacitance electrode 160 and a third insulating layer 162 form the second capacitive element 144, as illustrated in FIG. 4. Furthermore, the second capacitance electrode 160 may be formed of a metal material in order that the second capacitance electrode 160 may have a function of a reflection board.

The opposite electrode 168 is preferably formed of a transparent conductive film such as an ITO film, an IZO film and the like having a translucent property and a conductive property to transmit light emitted by the organic layer 166.

A sealing layer 172 is provided on the light emitting element 140. The sealing layer 172 is provided to cover the light emitting element 140 and prevent entrance of water or the like. The sealing layer 172 preferably has a translucent property by a film such as a silicon nitride film, an aluminum oxide film or the like. On the top of the sealing layer 172, a filling material may be provided between the sealing layer 172 and the second substrate 104. The second substrate 104 may be provided with a light shielding layer 182 and the color filter layer 184. When only white light is emitted from the light emitting element 140, as described above, the display device 100 can perform color display by being provided with the color filter layer 184.

In FIG. 3, the sealing region 110 and the second wiring extension region 130 are provided with an opening 174, which penetrates the second insulating layer 158, and the third insulating layer 162 is provided along the opening 174. The opening 174 is provided along at least one side of the pixel region 106, and the second insulating layer 158 is separated into a region on the side of the pixel region 106 and a region on the side of the driving circuit region 112. The bank layer 170 is also similarly separated by the opening 174. The opposite electrode 168 provided to cover an upper surface of the bank layer 170 includes a region extending from the pixel region 106, provided along the opening 174, and continuing over the driving circuit region 112. Further, the sealing layer 172 is provided to cover an entire surface of the opposite electrode 168.

The sealing region 110 and the second wiring extension region 130 have the opening 174 which separates the second insulating layer 158 and the bank layer 170 each formed of an organic resin material. The third insulating layer 162 and the opposite electrode 168 are respectively disposed on a side surface and a bottom surface of the opening 174. The third insulating layer 162 and the opposite electrode 168 closely contact at the bottom of the opening 174 formed in the second insulating layer 158 and the bank layer 170. The second insulating layer 158 and the bank layer 170 each formed of an organic resin material are covered with the sealing layer 172 containing an inorganic material, as described above. Thus, water or the like can be prevented from entering the pixel region 106 from the sealing region 110. That is, the sealing structure can prevent water or the like from entering the pixel region 106 via the second insulating layer 158 and the bank layer 170 each formed of an organic resin material.

The opening 174, which separates the second insulating layer 158 and the bank layer 170, and a stacked structure provided in the opening 174 are provided to prevent water from entering the organic layer 166, and is also referred to as a "water shut-off region" or a "water shut-off structure".

The sealing region 110 is provided with the sealing material 134. The sealing material 134 directly or indirectly adhere the first substrate 102 and the second substrate 104 each other. The sealing material 134 blocks a region between the first substrate 102 and the second substrate 104 from the atmosphere, and the pixel region 106 is enclosed in the region. A portion between the sealing layer 172 and the color filter layer 184 may be filled with a filling material composed of transparent resin such as acrylic resin, or may be sealed with inert gas.

The second substrate 104 is arranged to oppose the first substrate 102, and is provided to cover the sealing region 110, the pixel region 106, the first wiring extension region 128, and the first driving circuit 124.

In the driving circuit region 112, the transistor 138 is provided, to form a circuit. The driving current region 112 may include a contact section 180 where the opposite electrode 168 is electrically connected to a wiring 178 in a layer therebelow. The opposite electrode 168 is controlled to a predetermined potential by being connected to the wiring 178. In the driving circuit region 112, a signal processing circuit is formed by a transistor having the same structure as that of the transistor 138 provided in the pixel region 106.

In FIG. 3, the second wiring extension region 130 is provided with a wiring 176. While the second wiring extension region 130 is provided between the pixel region 106 and the driving circuit region 112, the first wiring extension region 128 may be provided in a part of the driving circuit region 112 as another mode.

The first substrate 102 includes an adjustment region 116 having a different Young's modulus. In other words, the first substrate 102 has a region, which differs in modulus of elasticity from the other regions, included in its part. This region is also referred to as a "substrate Young's modulus adjustment region" because it is a region where the Young's modulus of the first substrate 102 is intentionally adjusted. In one embodiment of the present invention, a modulus of elasticity is represented by a Young's modulus. When the first substrate 102 exhibits linear elasticity, a stress is proportional to a strain, and a constant of proportion is referred to as a modulus of elasticity. Particularly, a modulus of elasticity with respect to a tensile (compressive) deformation in one direction is referred to as a Young's modulus.

In FIG. 3, the adjustment region 116 is provided in the opening 174. That is, the adjustment region 116 is provided within the second wiring extension region 130 between the pixel region 106 and the driving circuit region 112. However, the present invention is not limited to this. The adjustment region 116 may be arranged in the bending section 120 in the first substrate 102. That is, the adjustment region 116 may be arranged between the pixel region 106 and the terminal section 136, and, for example, may also be provided between the driving circuit region 112 and the terminal section 136.

In the present embodiment, in the display region 100, the adjustment region 116 in the first substrate 102 is provided with a region having a low Young's modulus. However, the present invention is not limited to this. The Young's modulus of the adjustment region 116 in the first substrate 102 may be set higher than those of the other regions. In the present embodiment, the Young's modulus of the first substrate 102 in the adjustment region 116 is set so that a plane where a deformation/strain generated when the first substrate 102 is bent becomes neutral (zero) (hereinafter referred to as a "neutral plane") is in the vicinity of the wiring 176. When the Young's modulus of the first substrate 102 is set so that the neutral plane is in the vicinity of the wiring 176, the wiring 176 in the second wiring extension region 130 can be prevented from being disconnected when the first substrate 102 is bent. Therefore, the reliability of the display device 100 can be prevented from being reduced by a bending stress. However, the present invention is not limited to this. A layer serving as a neutral plane can be selected among layers included in the bending section 120, as needed. Thus, the Young's modulus of the adjustment region 116 in the first substrate 102 can be set.

Figure 5A:
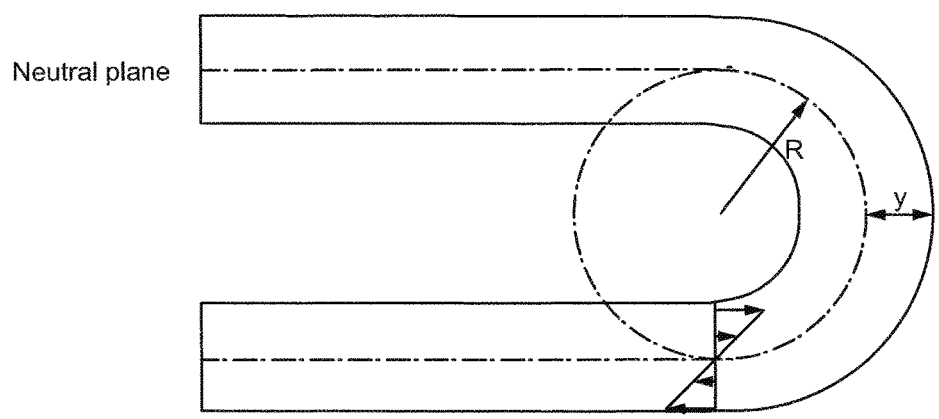
FIGS. 5A and 5B are a diagram illustrating a relationship between a neutral plane and a Young's modulus in a bending section.
Figure 5B:
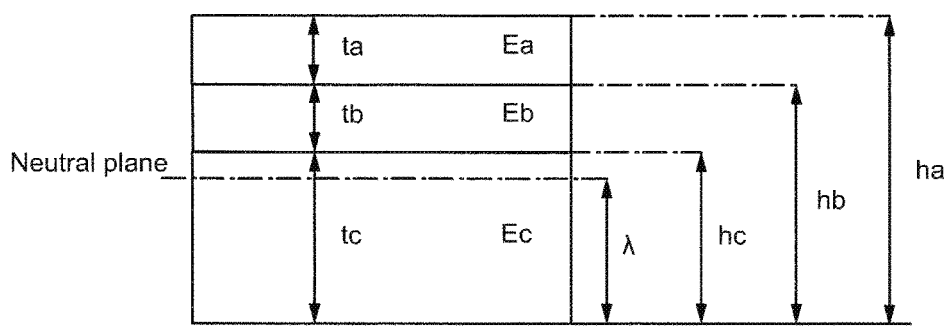

The deformation/strain generated when the first substrate 102 is bent can be expressed by an equation 1 from parameters illustrated in FIG. 5A. A relationship between a neutral plane and a Young's modulus can be expressed by an equation 2 from parameters illustrated in FIG. 5B:

$$\in_P = y/R \quad \text{[Equation 1]}$$

Figure 6A:
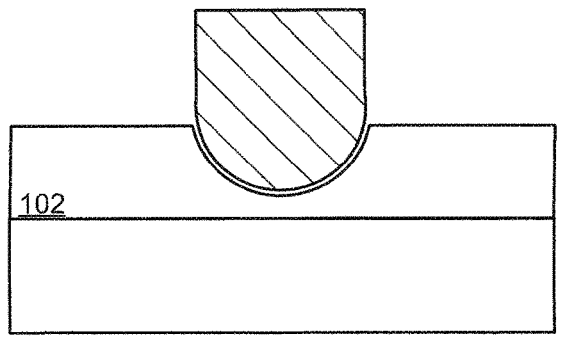
FIGS. 6A, 6B, and 6C are a cross-sectional view illustrating a method of processing the display device according to the present embodiment.
Figure 6B:
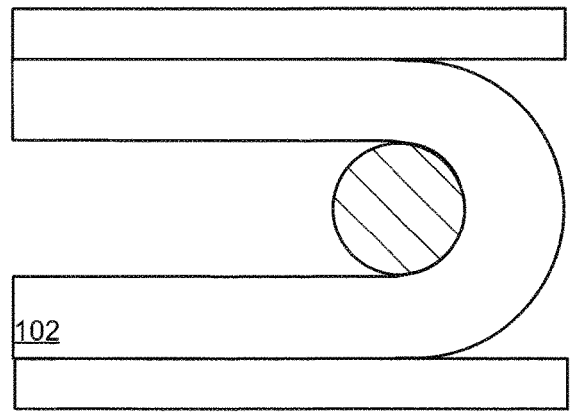
Figure 6C:
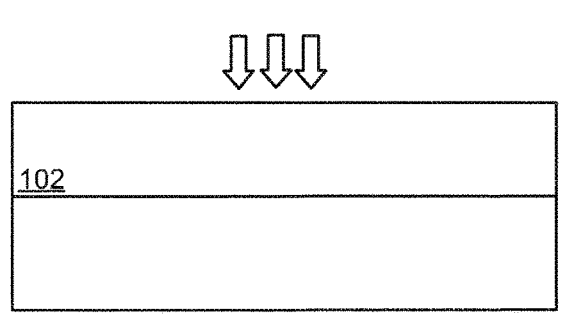

$\in_P$: deformation/strain in stacking direction
y: position in stacking direction from neutral plane
R: radius of curvature $$\lambda = \frac{\sum_{i=1}^{n} E_i(h_i^2 - h_{i-1}^2)}{2\sum_{i=1}^{n} E_i t_i} \quad \text{[Equation 2]}$$

λ: thickness from origin to neutral axis in stacking direction
$t_{a-c}$: thickness of each layer before load is applied
$E_{a-c}$: Young's modulus of each layer
h: thickness from origin to surface of each layer in stacking direction The adjustment region 116 can be formed by processing the first substrate 102 before elements such as transistors and the like respectively included in the pixel region 106, the first driving circuit 124, and the second driving circuit 126 are formed thereon. In the present embodiment, the existing method can be used to form the display device 100, and hence description thereof is omitted. In FIG. 6A to FIG. 6C, a method of processing the first substrate 102 will be specifically described.

FIG. 6A illustrates a method of applying a stress to the first substrate 102 to reduce a Young's modulus of the adjustment region 116. For example, the Young's modulus of the adjustment region 116 can be reduced by performing pressurization processing using a push stick or the like for a first surface, on which the elements will be formed, of the first substrate 102 formed on a supporting substrate. FIG. 6B illustrates a method of applying a stress to the first substrate 102 in a film shape, for example, to reduce the Young's modulus of the adjustment region 116. When the first substrate 102 in a film shape is subjected to pressurization processing by being passed through a narrow gap, the Young's modulus of the adjustment region 116 can be reduced. However, a method for pressurization processing is not limited to these. A stress may be able to be applied to the adjustment region 116. The first substrate 102 having flexibility decreases in Young's modulus when a stress exceeding an elastic limit is applied thereto. The Young's modulus of the adjustment region 116 of the first substrate 102 can be reduced by pressurization processing. In other words, the Young's modulus of a region where pressurization processing is not performed can also be kept high. While the thickness of the first substrate 102 does not change even using the methods illustrated in FIG. 6A and FIG. 6B, the substrate thickness in the adjustment region 116 may decrease, as described below.

FIG. 6C illustrates a method of reducing the Young's modulus of the adjustment region 116 by performing plasma processing for the first substrate 102. For example, the Young's modulus of the adjustment region 116 can be reduced by performing glow discharge plasma processing of gas containing nitrogen monoxide for the first surface, on which the elements will be formed, of the first substrate 102 formed on the supporting substrate. Examples of the gas used for plasma processing can include oxygen, argon, nitrogen, and carbon tetrafluoride. Plasma processing may be performed under ordinary pressure or under reduced pressure. The first substrate 102 composed of a high-polymer material decreases in Young's modulus when a cross-link is cut by performing plasma processing. The Young's modulus of the adjustment region 116 in the first substrate 102 can be reduced by the plasma processing. In other words, the Young's modulus of the region where plasma processing is not performed can also be kept high.

Figure 7A:
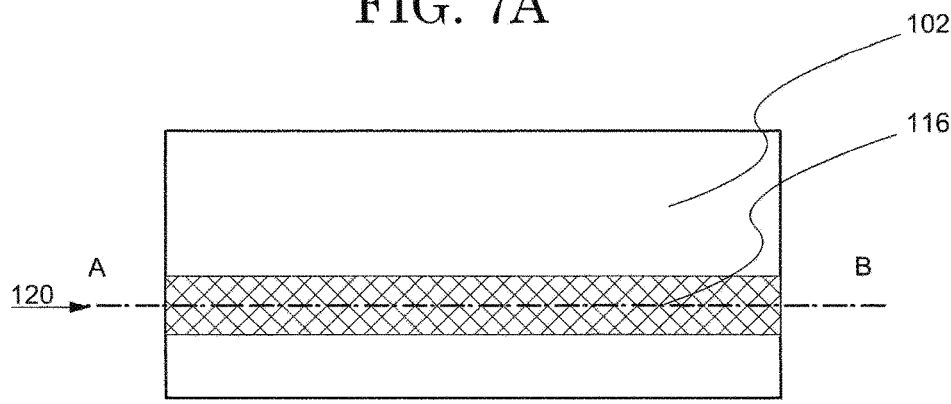
FIGS. 7A, 7B, and 7C are a top view illustrating an adjustment region after processing according to the present embodiment.
Figure 7B:
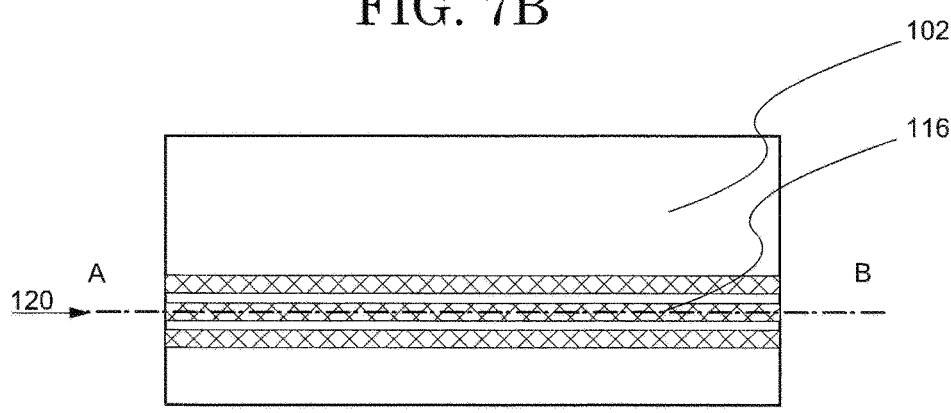
Figure 7C:
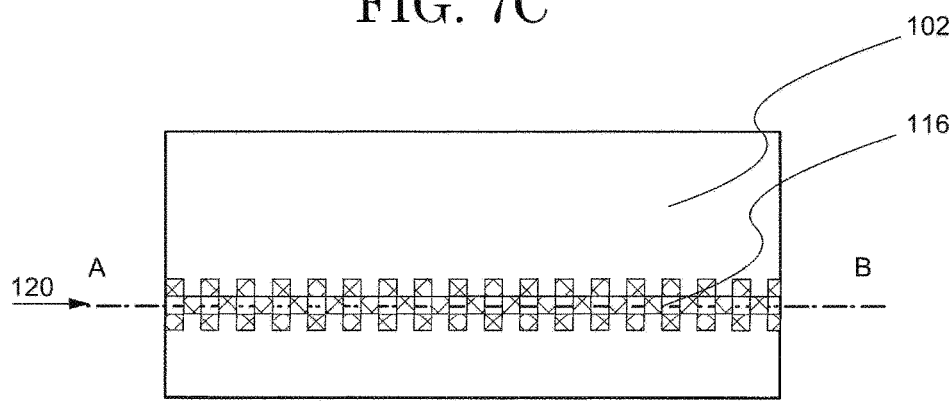

When the first substrate 102 is subjected to processing using the method illustrated in FIG. 6A to FIG. 6C, the Young's modulus of the adjustment region 116 can be adjusted. FIG. 7A to FIG. 7C is a top view illustrating an example of the first substrate 102 which has been subjected to processing.

FIG. 7A illustrates a mode in which the adjustment region 116 is provided as a region extending in a band shape from one end to the other end of the first substrate 102. The Young's modulus of the adjustment region 116 in the first substrate 102 is relatively lower than the Young's modulus of an adjacent region. Thus, the first substrate 102 is easily bent or folded along the adjustment region 116. As a result of such processing, a boundary between the adjustment region 116 and the adjacent region may steeply change in Young's modulus, or may gradually or continuously change in Young's modulus. When the adjustment region 116 is provided so that the Young's modulus continuously changes, a bending stress generated in the bending section 120 is dispersed, and a stress can be prevented from being applied to the boundary between the adjustment region 116 and the adjacent region.

As illustrated in FIG. 7B, regions each having a low Young's modulus may be discretely provided within the adjustment region 116. When the regions where the Young's modulus is reduced are discretely provided, a bending stress generated in the bending section 120 can be dispersed while rigidity of the first substrate 102 is maintained. An area ratio of the region where the Young's modulus is reduced and the region where the Young's modulus is not reduced is adjusted so that an average of the Young's moduli in the entire adjustment region 116 can be adjusted.

As illustrated in FIG. 7C, regions each having a low Young's modulus may be provided in a lattice shape within the adjustment region 116. When the regions where the Young's modulus is reduced are provided in a lattice shape, a bending stress generated in the bending section 120 can be dispersed while more uniform rigidity is maintained. When the area ratio of the region where the Young's modulus is reduced and the region where the Young's modulus is not reduced is adjusted, an average of the Young's moduli in the entire adjustment region 116 can be adjusted.

The width of the adjustment region 116 can be adjusted, as needed. For example, the width of the adjustment region 116 may be adjusted depending on a radius of curvature for bending the first substrate 102. As a result of such processing, another physical property of the adjustment region 116 in the first substrate 102 may change. For example, in adjustment region 116, a substrate thickness may be made smaller than those in the other regions. That is, the substrate thickness in the adjustment region 116 may be smaller than the substrate thickness in the pixel region 106 in the first substrate 102.

On the first substrate 102, which has been subjected to processing, elements such as transistors, wirings, terminals and the like respectively included in the pixel region 106, the first driving circuit 124, and the second driving circuit 126, is formed using the existing method. In a method using a supporting substrate, when the supporting substrate is separated and the first substrate 102 is bent in the adjustment region 116, the display device 100 according to the present embodiment can be obtained.

Figure 8:
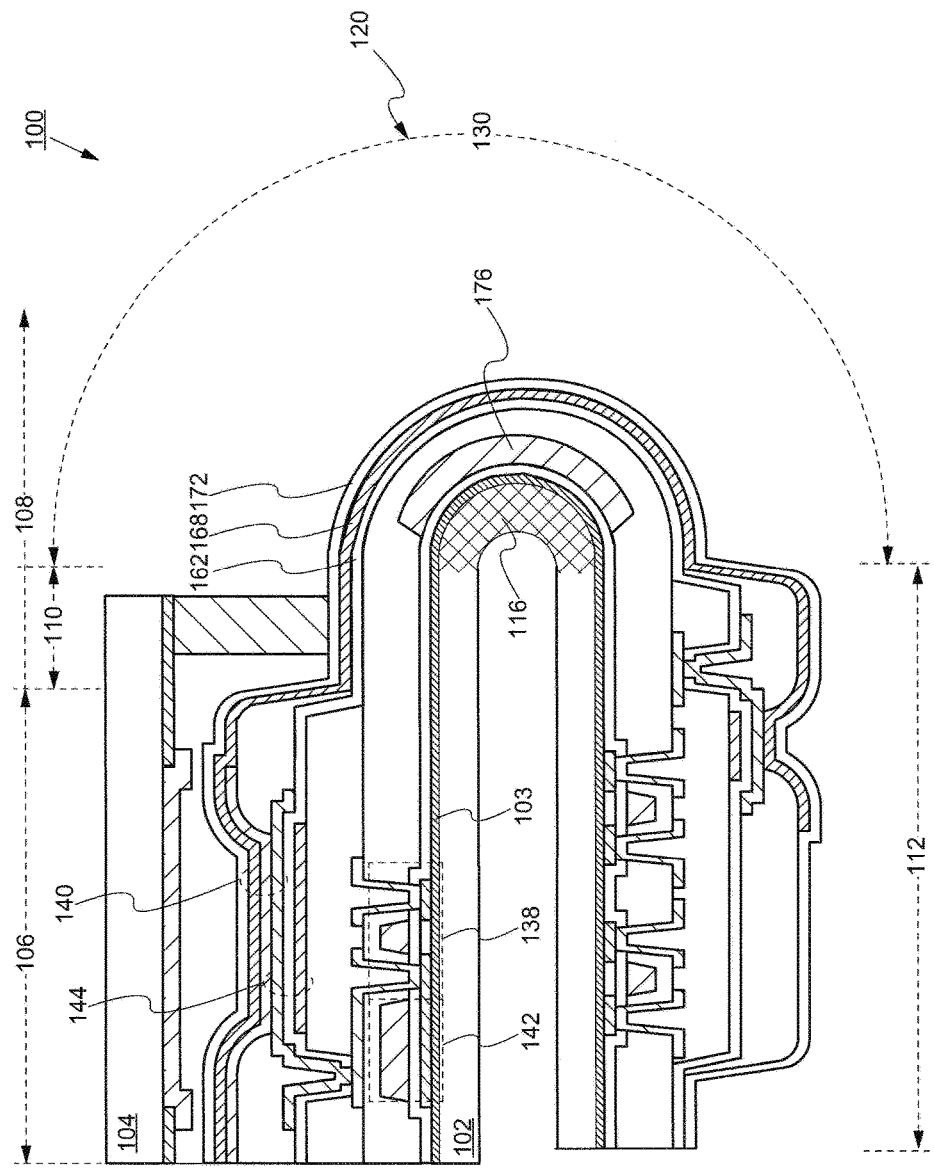
FIG. 8 is a cross-sectional view illustrating a configuration of the display device according to the present embodiment.

FIG. 8 illustrates an example in which the first substrate 102 is bent toward a second surface on the opposite side to the first surface of the first substrate 102 in the bending section 120. The bending section 120 is arranged so that its part overlaps the adjustment region 116. In the present embodiment, the bending section 120 is positioned in the second wiring extension region 130 between the pixel region 106 and the driving circuit region 112. Thus, when the first substrate 102 is bent, the driving circuit region 112 (and the terminal section 136) is arranged on the side of a back surface of the pixel region 106. The bending section 120 is not provided with an element such as a transistor and the like, and is provided with a wiring 176. The wiring 176 is formed of a metal material such as aluminum and the like, and has flexibility. Therefore, even if the first substrate 102 is bent, the conductivity of the wiring 176 does not decrease.

When the adjustment region 116 is arranged in the bending section 120, as illustrated in FIG. 8, a portion along which the first substrate 102 is folded is limited to a Young's modulus adjustment region. When the Young's modulus of the first substrate 102 in the bending section 120 is adjusted, respective bending resistances of the wiring 176, the third insulating layer 162, the opposite electrode 168, and the sealing layer 172 can be improved. That is, even if the first substrate 102 is folded along the bending section 120, an effect of a stress on the wiring 176 can be reduced. Thus, the wiring 176 can be prevented from being disconnected in the bending section 120, and the reliability of the display device 100 can be prevented from being reduced by a bending stress.

The Young's modulus of the adjustment region 116 in the first substrate 102 has been adjusted. Thus, even if the first substrate 102 is bent by approximately 180 degrees, a stress on the first substrate 102 is relaxed. An angle at which the first substrate 102 is bent is optional. The first substrate 102 may be bent by an angle of approximately 180 degrees, e.g., an angle of 90 degrees.

The adjustment region 116 in the first substrate 102 has a lower Young's modulus than those of the other regions. Thus, the rigidity of the first substrate 102 is relatively reduced. The display device 100 includes the adjustment region 116 so that the first substrate 102 can be easily bent in the adjustment region 116. In other words, a region along which the first substrate 102 is bent can be designated with the adjustment region 116 used as a bending section.

A region adjacent to the adjustment region 116 in the first substrate 102 has a higher Young's modulus than that of the adjustment region 116. Thus, the rigidity of the first substrate 102 is relatively high. When the display device 100 includes the adjustment region 116, a bending stress can be prevented from being directly exerted on the respective elements such as the transistors and the like included in the pixel region 106, the first driving circuit 124, and the second driving circuit 126. As a result, the reliability of the display device 100 can be prevented from being reduced by a bending stress.

In the display device 100, if a direction of light emission from the light emitting element 140 is a direction toward the second substrate 104 (if the display device 100 is of a top emission type), the driving circuit region 112 may be folded toward the second surface of the first substrate 102 in the bending section 120. If the direction of light emission from the light emitting element 140 is a direction toward the second surface of the first substrate 102 (if the display device 100 is of a bottom emission type), the driving circuit region 112 may be folded toward the first surface of the first substrate 102 in the bending section 120. In either case, the frame of the display device 100 can be narrowed when the driving circuit region 112 (and the terminal section 136) is bent to be on the side of the back surface of the pixel region 106, as illustrated in FIG. 8.

<Stereoscopic Configuration of Display Device>

Figure 9:
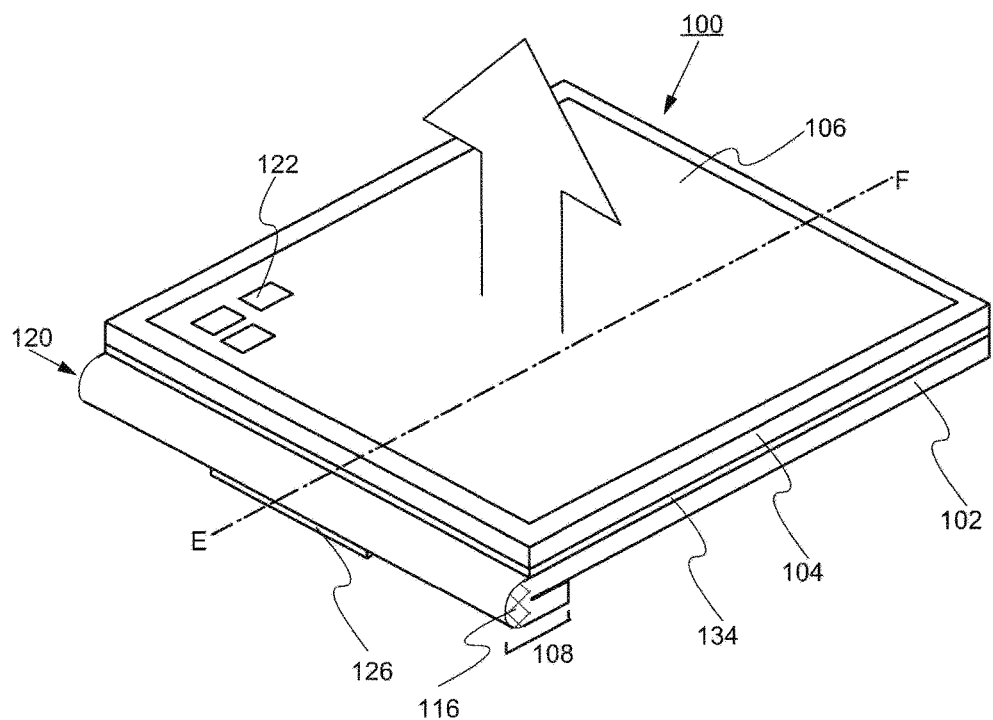
FIG. 9 is a perspective view illustrating a configuration of the display device according to the present embodiment.
Figure 10:
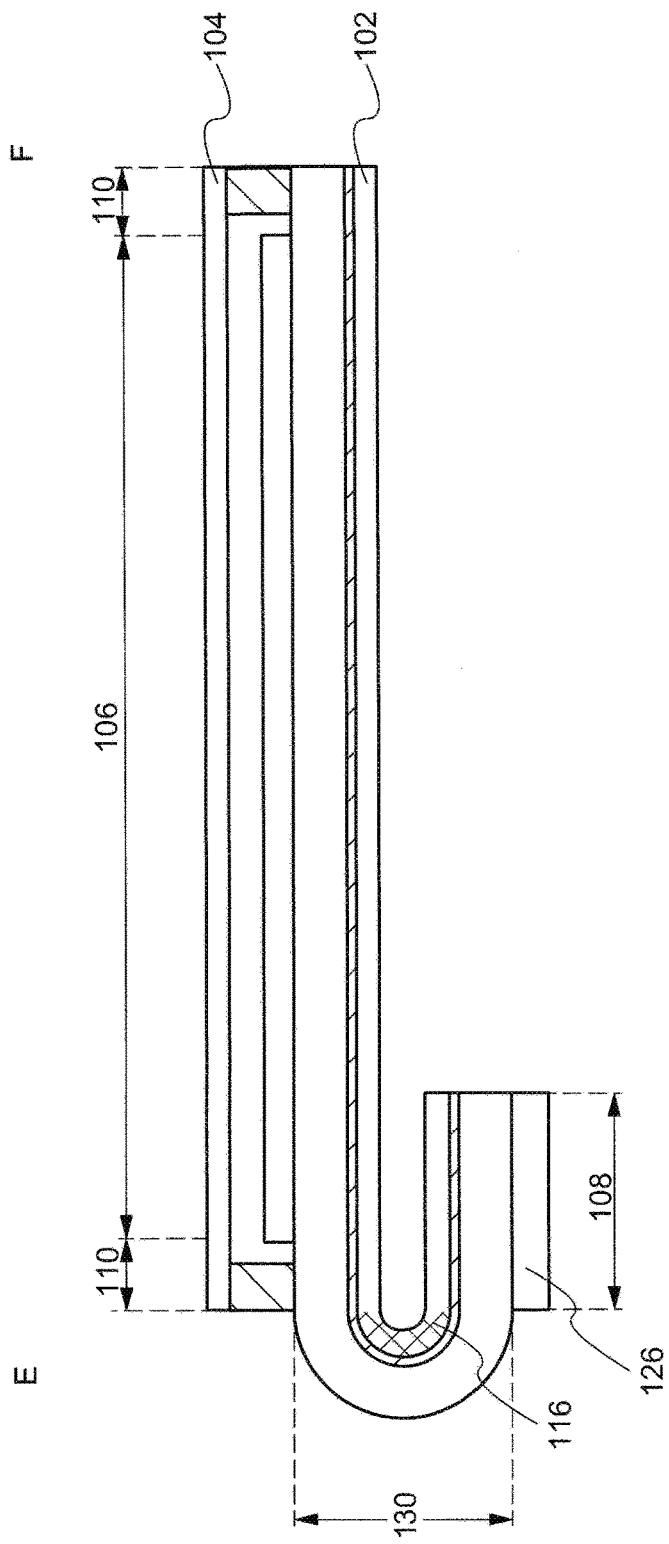
FIG. 10 is a cross-sectional view illustrating the configuration of the display device according to the present embodiment.

FIG. 9 is a perspective view illustrating a configuration of the display device 100 according to the present embodiment, illustrating one mode in which a substrate has been bent. FIG. 10 illustrates a cross-sectional structure corresponding to a line E-F illustrated in FIG. 9. In the display device 100, the second substrate 104 opposing the first surface of the first substrate 102 is arranged. The display device 100 is provided with the pixel region 106. The pixel region 106 has a plurality of pixels arranged therein, to form a display screen. The first substrate 102 includes the adjustment region 116 where the Young's modulus of the substrate has been adjusted in the bending section 120. The adjustment region 116 extends from one end to the other end of the first substrate 102 along one side of the pixel region 106.

The first substrate 102 is molded so that the Young's modulus of the substrate in the adjustment region 116 becomes lower than those in the other regions. The adjustment region 116 in the first substrate 102 is arranged to be included in the second wiring extension region 130.

FIG. 9 and FIG. 10 each illustrate a mode in which the second driving circuit 126 and the terminal section 136 are bent toward the surface on the opposite side (on the side of the back surface) of the display screen formed by the pixel region 106. Thus, the frame region 108 including the driving circuit region 112 and the terminal section 136 is arranged on the side of the back surface of the display screen so that the frame of the display device 100 can be narrowed. The Young's modulus of the adjustment region 116 in the first substrate 102 has been adjusted. Therefore, an effect of a stress on the wiring 176 in the second wiring extension region 130 can be reduced. Thus, the wiring 176 can be prevented from being disconnected in the bending section 120, and the reliability of the display device 100 can be prevented from being reduced by a bending stress.

Furthermore, according to the present embodiment, the display device 100 can be preferentially bent in the adjustment region 116, and the pixel region 106 and the driving circuit region 112 can be prevented from being bent. Thus, a bending stress can be prevented from being exerted on the pixel region 106 and the driving circuit region 112. A position where the display device 100 is bent is specified so that a product shape can be stabilized.

In the present embodiment, a direction in which the adjustment region 116 is extended is not limited to one direction. The adjustment region 116 may be provided between the pixel region 106 and the first driving circuit 124. In this case, the adjustment region 116 can similarly function as the bending section 120. Thus, the frame region 108 including the first driving circuit 124 is arranged on the side of the back surface of the display screen so that the frame of the display device 100 can be further narrowed.

As described above, according to the one embodiment of the present invention, when a region where a Young's modulus of a substrate has been adjusted is provided in a part of a display device, a position at which the substrate is folded is easily specified, and a product shape can be stabilized. A difference between stresses on the front and the back generated on the substrate can be reduced in the bending section in the substrate, and the reliability of the display device can be prevented from being reduced.

What is claimed is:

1. A display device comprising:
   a first substrate having flexibility including a pixel region and a frame region around the pixel region;
   a pixel arranged on a first surface of the first substrate in the pixel region; and
   a terminal section arranged in the frame region and connected to the pixel,
   wherein the first substrate includes an adjustment region between the pixel and the terminal section, the adjustment region having a different Young's modulus from those of the pixel region and the frame region.

2. The display device according to claim 1, wherein the adjustment region has a lower Young's modulus than those of the pixel region and the frame region.

3. The display device according to claim 2, wherein
   the first substrate has a first side and a second side different from the first side, and
   the adjustment region is provided from the first side to the second side, and the first substrate is bent along the adjustment region.

4. The display device according to claim 3, wherein the first substrate is bent toward a second surface on the opposite side to the first surface.

5. The display device according to claim 1, wherein
   the first substrate includes a second substrate opposing the first surface of the first substrate and sealing the pixel region, and
   the adjustment region is arranged outside the second substrate.

6. The display device according to claim 5, wherein
   the first substrate further includes a driving circuit connected to the pixel, and
   the adjustment region is arranged between the pixel and the driving circuit.

7. A method of manufacturing a display device, comprising:
   forming a first substrate having flexibility on a supporting substrate;
   forming an adjustment region having a different Young's modulus from those of other regions in the first substrate by processing a first surface on the opposite side to the supporting substrate of the first substrate
   forming a pixel and a terminal section connected to the pixel with the adjustment region sandwiched therebetween;
   separating the supporting substrate; and
   bending the first substrate along the adjustment region.

8. The method of manufacturing the display device according to claim 7, wherein the first substrate is bent toward a second surface on the opposite side to the first surface.

9. The method of manufacturing the display device according to claim 8, wherein a Young's modulus of the adjustment region is reduced by performing pressurization processing for the adjustment region.

10. The method of manufacturing the display device according to claim 8, wherein a Young's modulus of the adjustment region is reduced by performing glow discharge plasma processing for the adjustment region.

11. The method of manufacturing the display device according to claim 10, wherein the glow discharge plasma processing is performed using glow discharge plasma of gas containing nitrogen monoxide.

12. The method of manufacturing the display device according to claim 7, wherein the first substrate is formed using an organic resin material.

13. The method of manufacturing the display device according to claim 12, wherein the first substrate is formed using polyimide.

* * * * *